United States Patent
Wald et al.

(10) Patent No.: US 12,189,012 B2
(45) Date of Patent: Jan. 7, 2025

(54) SYSTEM AND METHOD FOR ELECTROMAGNETIC INTERFERENCE MITIGATION FOR PORTABLE MRI SYSTEMS

(71) Applicant: The General Hospital Corporation, Boston, MA (US)

(72) Inventors: Lawrence L. Wald, Cambridge, MA (US); Clarissa Zimmerman-Cooley, Boston, MA (US); Sai Abitha Srinivas, Boston, MA (US); Stephen Cauley, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 17/996,856

(22) PCT Filed: Apr. 26, 2021

(86) PCT No.: PCT/US2021/029164
§ 371 (c)(1),
(2) Date: Oct. 21, 2022

(87) PCT Pub. No.: WO2021/217135
PCT Pub. Date: Oct. 28, 2021

(65) Prior Publication Data
US 2023/0132819 A1 May 4, 2023

Related U.S. Application Data

(60) Provisional application No. 63/015,092, filed on Apr. 24, 2020.

(51) Int. Cl.
G01R 33/56 (2006.01)
G01R 33/422 (2006.01)
G01R 33/44 (2006.01)

(52) U.S. Cl.
CPC ....... *G01R 33/5608* (2013.01); *G01R 33/422* (2013.01); *G01R 33/44* (2013.01)

(58) Field of Classification Search
CPC ... G01R 33/422; G01R 33/44; G01R 33/5608
See application file for complete search history.

(56) References Cited

U.S. PATENT DOCUMENTS

| 10,775,454 B2 * | 9/2020 | Poole ................. G01R 33/3858 |
| 2006/0118319 A1 | 6/2006 | Wang et al. |

(Continued)

FOREIGN PATENT DOCUMENTS

WO  2016037028 A1  3/2016

OTHER PUBLICATIONS

Anami, Kimitaka et al. "Stepping stone sampling for retrieving artifact-free electroencephalogram during functional magnetic resonance imaging." NeuroImage vol. 19,2 Pt 1 (2003): 281-95. doi:10.1016/s1053-8119(03)00048-x.

(Continued)

*Primary Examiner* — Gregory H Curran
(74) *Attorney, Agent, or Firm* — Quarles & Brady LLP

(57) ABSTRACT

Electromagnetic interference ("EMI") is mitigated for portable magnetic resonance imaging ("MRI") systems using postprocessing interference suppression techniques that make use of EMI detectors external to the MRI system imaging volume to detect EMI signals and remove them from acquired magnetic resonance data. EMI correction models, including static transfer function-based models, dynamic transfer function-based models, correction weight-based models, or parallel imaging kernel-based models can be used to remove the EMI-related artifacts from the magnetic resonance data.

17 Claims, 10 Drawing Sheets

(56) References Cited

U.S. PATENT DOCUMENTS

| | | | |
|---|---|---|---|
| 2011/0160565 A1* | 6/2011 | Stubbs | A61N 1/37 |
| | | | 607/11 |
| 2014/0155732 A1 | 6/2014 | Patz et al. | |
| 2014/0288412 A1 | 9/2014 | Schwartz | |
| 2016/0169993 A1* | 6/2016 | Rearick | G01R 33/3875 |
| | | | 324/309 |
| 2020/0058106 A1 | 2/2020 | Lazarus et al. | |
| 2020/0069949 A1 | 3/2020 | Ghosh | |

OTHER PUBLICATIONS

Cooley, Clarissa Zimmerman et al. "Design of sparse Halbach magnet arrays for portable MRI using a genetic algorithm." IEEE transactions on magnetics vol. 54, 1 (2018): 5100112. doi:10.1109/TMAG.2017.2751001.

Cooley, Clarissa Zimmerman et al. "Two-dimensional imaging in a lightweight portable MRI scanner without gradient coils." Magnetic resonance in medicine vol. 73,2 (2015): 872-83. doi:10.1002/mrm.25147.

LaPierre, C. D., et al. "A single channel spiral volume coil for in vivo imaging of the whole human brain at 6.5 mT." International Society of Magnetic Resonance in Medicine. vol. 5902. 2015.

McDaniel, P. C., et al. "3D imaging with a portable MRI scanner using an optimized rotating magnet and 1D gradient coil." Proceedings of the International Society for Magnetic Resonance in Medicine. Paris (2018): 0029.

McDaniel, Patrick C., et al. "A target-field shimming approach for improving the encoding performance of a lightweight Halbach magnet for portable brain MRI." Proc. 27th Annu. Meet. ISMRM Montr 215 (2019): 2019.

International Search Report in PCT/US2021/029164; received on Sep. 30, 2021.

* cited by examiner

SYSTEM AND METHOD FOR ELECTROMAGNETIC INTERFERENCE MITIGATION FOR PORTABLE MRI SYSTEMS

CROSS-REFERENCE TO RELATED APPLICATIONS

This application represents the U.S. national stage entry of International Application No. PCT/US2021/029164 filed Apr. 26, 2021, which is based on and claims the benefit of U.S. Provisional Patent Application Ser. No. 63/015,092, filed on Apr. 24, 2020, and entitled "SYSTEM AND METHOD FOR ELECTROMAGNETIC INTERFERENCE MITIGATION FOR PORTABLE MRI SYSTEMS." The contents of these applications are incorporated herein by reference in their entirety.

STATEMENT REGARDING FEDERALLY SPONSORED RESEARCH

This invention was made with government support under EB018976 awarded by the National Institutes of Health. The government has certain rights in the invention.

BACKGROUND

Electromagnetic interference ("EMI") contaminates magnetic resonance signals and decreases the diagnostic quality of the image. The nuisance signals from EMI are detected the same way as the magnetic resonance signals originating from spins (i.e., through Faraday detection with primary MR imaging coils). Conventional MRI scanners use radio frequency ("RF") shielded enclosures to reduce EMI.

Specialized low-field, portable point-of-care ("POC") MRI systems have the advantage of being low-cost, lightweight, and mobile and could extend the use of MRI to unconventional locations. However, the necessity of an RF shielded room to mitigate EMI renders these portable systems no longer portable, and therefore precludes their use in a POC setting. The performance of a low-field POC MRI system operating outside an RF shielded room is adversely affected by the presence of EMI signals, which produce image artifacts, sometimes complicated enough to be confused with image noise. To enable truly portable MRI devices, alternative approaches to EMI suppression are needed.

SUMMARY OF THE DISCLOSURE

The present disclosure addresses the aforementioned drawbacks by providing a method for generating a magnetic resonance image. The method includes acquiring magnetic resonance data from a subject using a magnetic resonance imaging ("MRI") system, and acquiring electromagnetic interference ("EMI") signal data using at least one EMI detector positioned external to an imaging volume of the MRI system. Corrected magnetic resonance data are then generated by computing an EMI correction model using the magnetic resonance data and the EMI signal data; applying the EMI correction model to the EMI signal data, generating output as correction data; and subtracting the correction data from the magnetic resonance data, generating output as the corrected magnetic resonance data. Artifacts associated with electromagnetic interference are reduced in the corrected magnetic resonance data as compared to the originally acquired magnetic resonance data. An image is then reconstructed from the corrected magnetic resonance data, where artifacts associated with electromagnetic interference are mitigated in the image.

It is another aspect of the present disclosure to provide an EMI mitigation system that includes a plurality of EMI detectors arranged in a spaced relationship sufficient to allow for positioning of an MRI system therebetween, wherein at least some of the EMI detectors in the plurality of EMI detectors comprise coils with orthogonal directionality.

It is yet another aspect of the present disclosure to provide a portable MRI system that includes a magnet assembly and at least one EMI detector arranged external to an imaging volume of the magnet assembly. The magnet assembly includes a housing without radio frequency ("RF") shielding, and houses a magnet, at least one gradient coil, and at least one RF coil.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for mitigating electromagnetic interference ("EMI") for portable magnetic resonance imaging ("MRI") systems. In general, EMI signals are mitigated using postprocessing interference suppression techniques that make use of an external reference coil and/or electrode to detect the EMI signals and remove them from the magnetic resonance data.

In some embodiments, an EMI measurement detector that is external to the imaging volume is used to measure interference as EMI signals. The EMI measurement detector may be one or more pickup coils. Additionally or alternatively, the EMI measurement detector may be one or more electrodes. An EMI correction model, which may be static or dynamic, can then be used to estimate the EMI picked up by the primary imaging coil and remove it in postprocessing from the primary magnetic resonance data. For instance, the EMI correction model can include complex weighting variables or transfer functions that relate the EMI signal data to the primary data. The EMI correction model is then applied to the EMI signal data, which are then removed from the primary magnetic resonance data. As a result, EMI-related artifacts are removed, suppressed, or otherwise reduced in images reconstructed from the corrected magnetic resonance data.

The systems and methods described in the present disclosure improves the image quality and allows for operation of a portable MRI system outside of an RF-shielded room. Advantageously, the systems and methods described in the present disclosure can be implemented using portable, low-field (e.g., less than 0.2 T, such as 80 mT) MRI systems.

Figure 1:
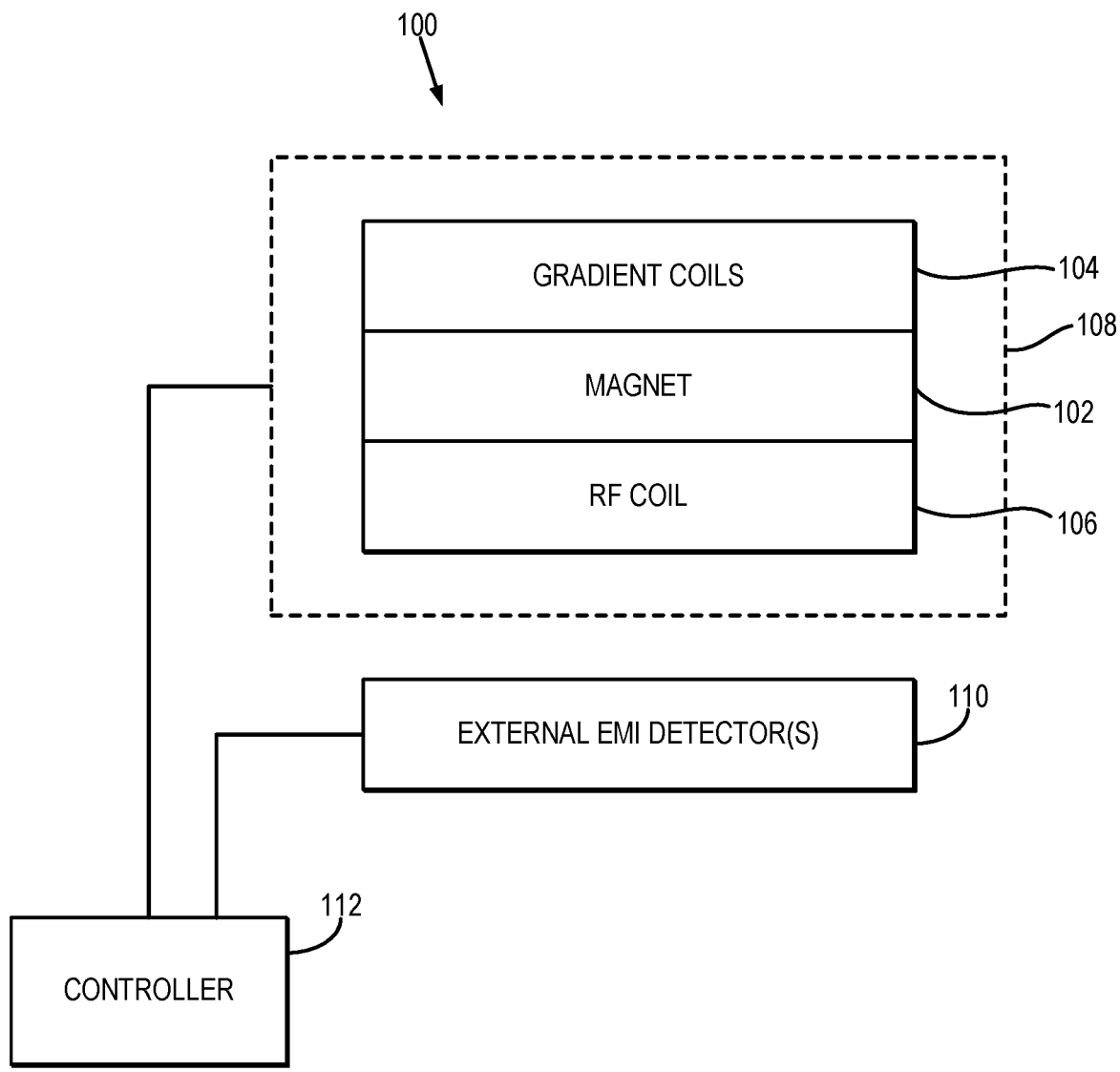
FIG. 1 is a block diagram of an example portable magnetic resonance imaging ("MRI") system that can implement the systems and methods described in the present disclosure.

Referring first to FIG. 1, a schematic block diagram of an example portable MRI system 100 is shown. In FIG. 1, a schematic representation of the position of various elements in the MRI system 100 with respect to one another is shown using blocks rather than the specific shape described above. The MRI system 100 includes a magnet assembly having a magnet 102, one or more gradient coils 104, and an RF coil 106, which in some configurations may be collectively housed in a housing 108. The magnet 102 may be a permanent magnet, an array of permanent magnets, an electromagnet, or a superconducting magnet. In some instances, the magnet 102 may be a single-sided magnet. As one non-limiting example, the magnet 102 can be a single-sided magnet designed from a plurality of permanent magnet blocks (e.g., NdFeB or other rare-earth element permanent magnet blocks) arranged on a former.

One or more gradient coils 104 can be configured to be positioned proximate the magnet 102. In one non-limiting example, the magnet 102 can be designed to have a $B_0$ gradient for readout and slice selection, and a pair of gradient coils may be used to enable phase encoding on the other two directions that are orthogonal to the readout direction. In other instances, the magnet 102 may have a homogeneous field over an imaging field-of-view, in which case three gradient coils may be used to provide spatial encoding in three orthogonal directions.

The RF coil 106 is also configured to be positioned proximate the magnet 102. The RF coil 106 may be used to provide excitation and RF signal detection. In other embodiments, separate RF coils can be provided for excitation and signal detection.

Figure 2A:
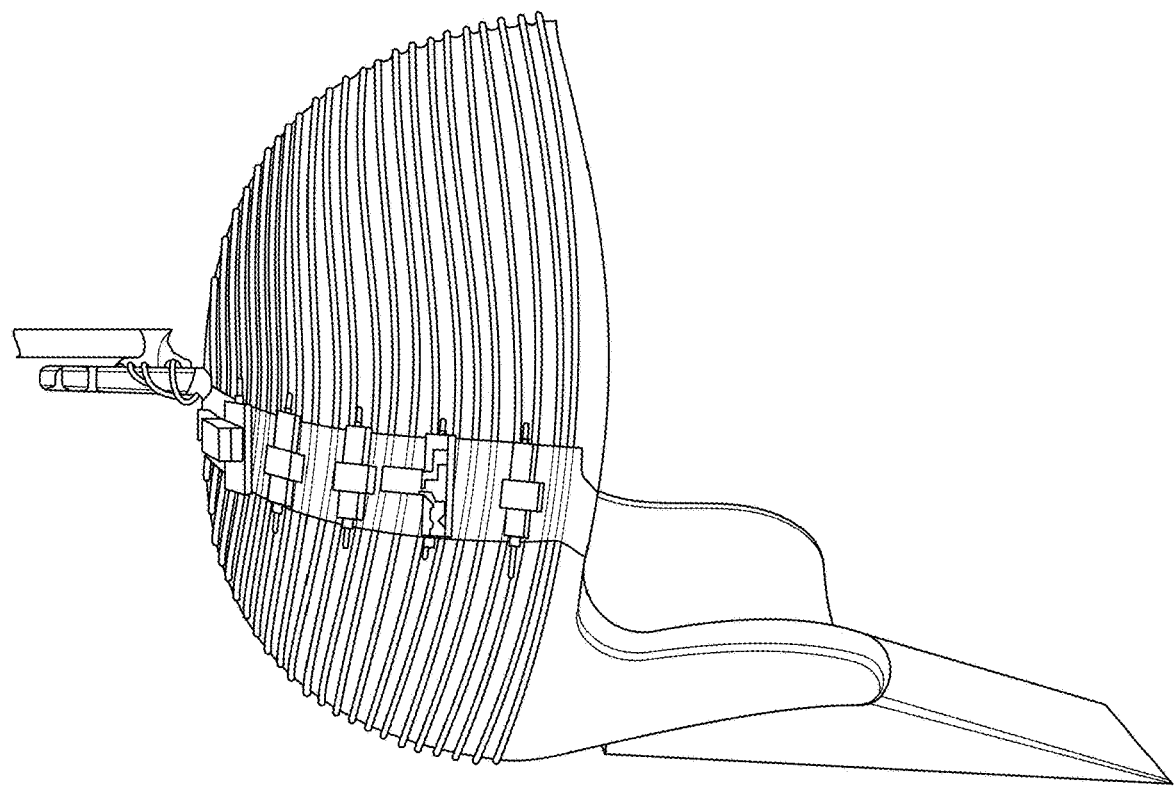
FIGS. 2A and 2B show an example pick-up coil that can be used as an external electromagnetic interference ("EMI") detector.
Figure 2B:
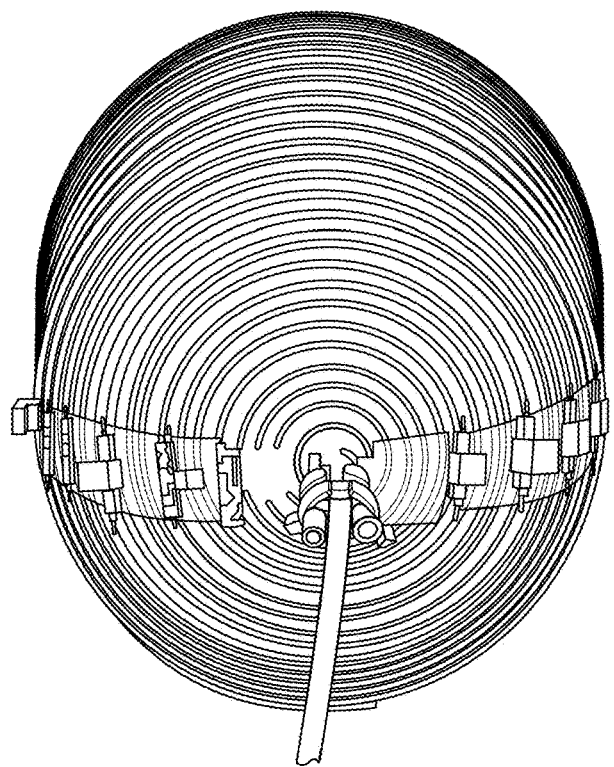

The MRI system 100 also includes an external EMI detector 110. As described above, the external EMI detector 110 is located external to the imaging volume of the magnet 102. As one example, the external EMI detector 110 can include one or more coils. For instance, the external EMI detector 110 can include a single channel coil, such as a spiral coil tuned to the Larmor frequency of the spins being imaged, with 30 turns and a Mini-circuits ZHL-500LN+ pre-amplifier, as shown in FIGS. 2A and 2B.

Figure 3:
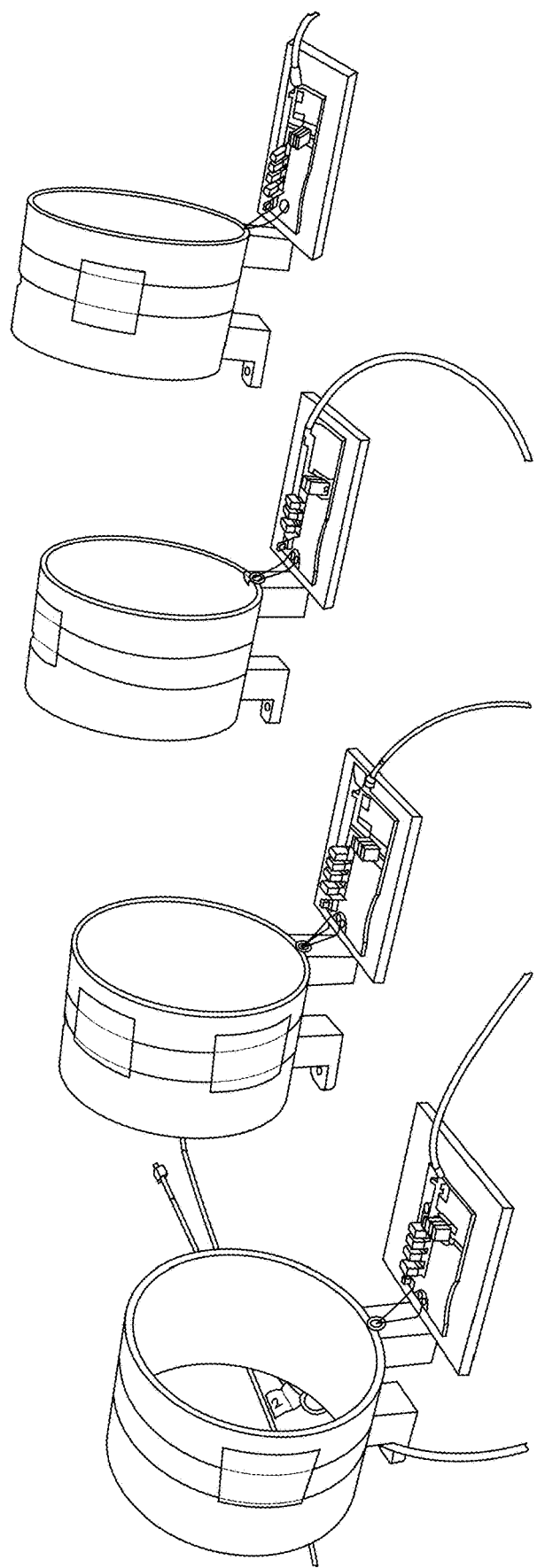
FIG. 3 shows an example of multiple pick-up coils that can be sued as external EMI detectors.
Figure 4A:
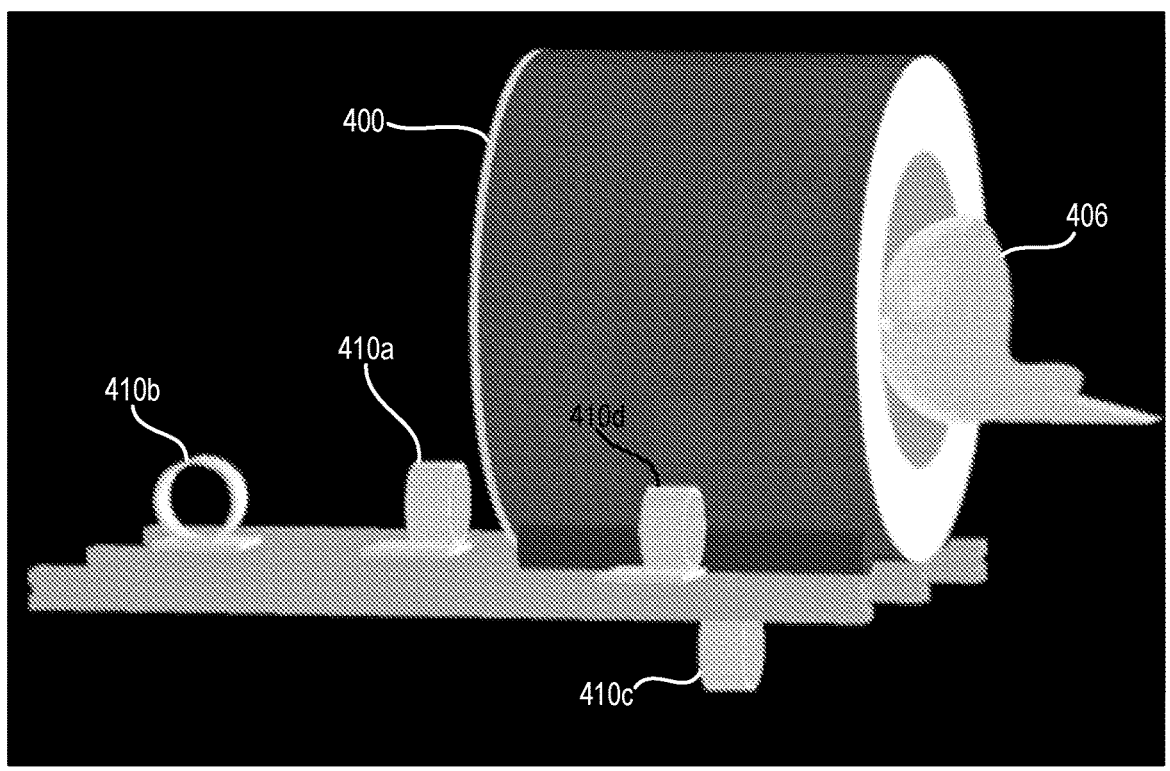
FIGS. 4A and 4B show an example of multiple pick-up coils being arranged externally around an MRI system.
Figure 4B:
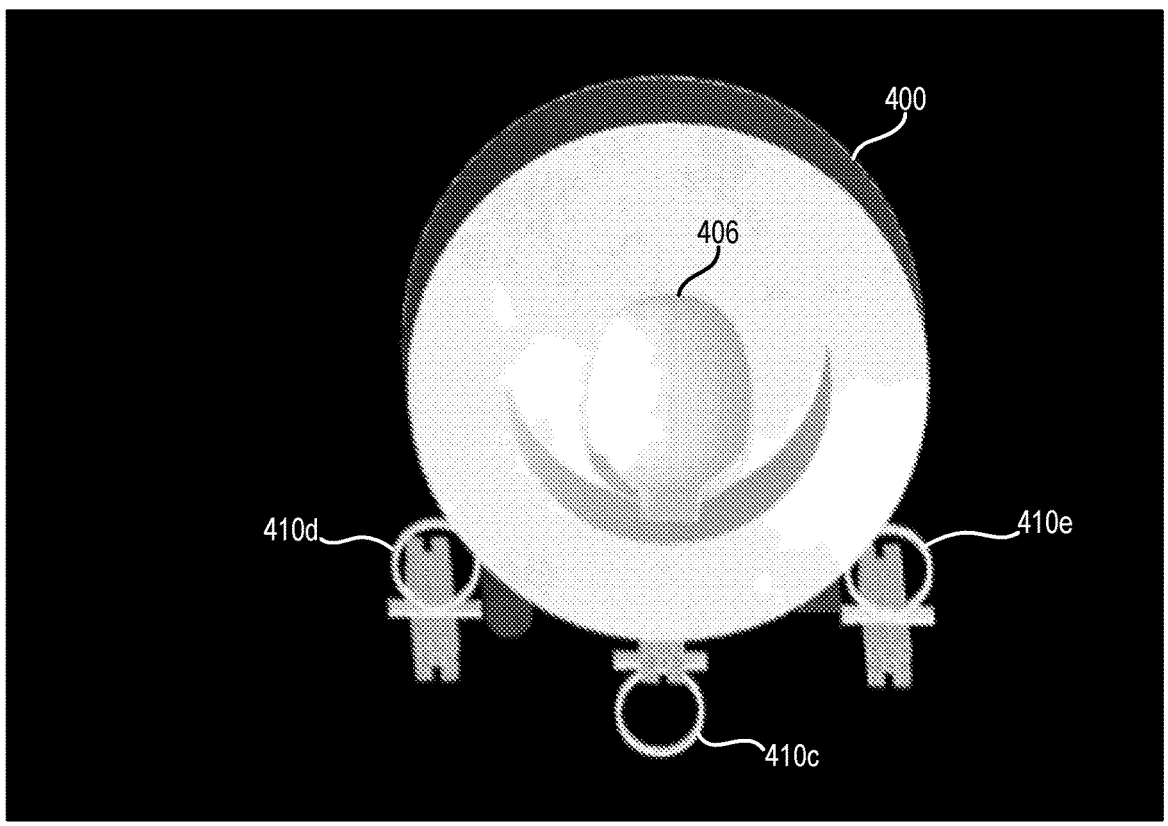

As another example, the external EMI detector 110 can include multiple coils, such as the coils shown in FIG. 3. These coils may include, for instance, 10 turns each and are each tuned to the Larmor frequency of the spins being imaged. Although four coils are shown in FIG. 3, more generally multiple coil implementations can include two or more coils, or alternatively a single coil can be used as described above. As a non-limiting example, five coils may be used and arranged around the MRI system as shown in FIGS. 4A and 4B. In this example, five identical EMI detectors 410 were built from 10-turn coils wound on 3D printed formers (OD=8 cm). These EMI detectors 410 were tuned and matched to the Larmor frequency (3.38 MHz) of the MRI scanner 400 with a bandwidth of 25 kHz to achieve a similar frequency response to the primary RF coil 406. Two detectors 410 were used with 50 Ohm 37 dB gain pre-amplifiers (MITEQ P/N AU 1583, NY, USA) and three detectors were used with 50 Ohm 24 dB gain preamplifiers (Mini-circuits ZHL-500LN+, NY, USA). Two of the EMI detectors 410a, 410b were placed behind the sides of the MRI scanner 400. One EMI detector 410c was placed underneath the MRI scanner 400, and the last two EMI detectors 410d, 410e were placed by the sides of the MRI scanner 410. EMI detectors 410a, 410c, 410d, and 410e were oriented along the B1 direction, and EMI detector 410b was oriented orthogonal to B1 to acquire EMI characteristics in an additional direction.

Figure 5:
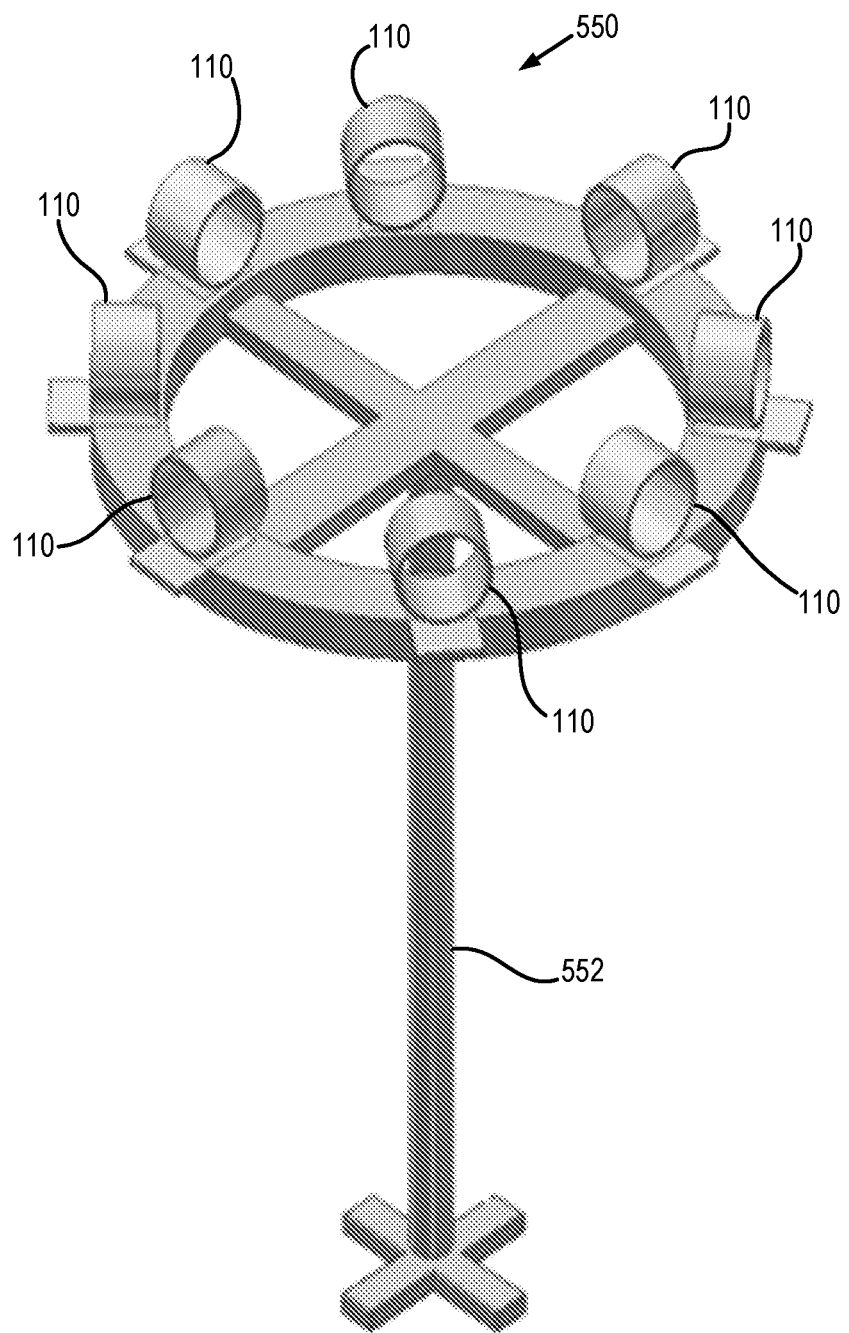
FIG. 5 shows an example of an external EMI detector that includes a plurality of coils coupled to a stand.

In still other examples, multiple coils can be arranged about the MRI scanner in other arrangements. For instance, the coils can be distributed 360 degrees around the MRI scanner. The multiple coils may also include coils with orthogonal directionality for increased detection capability for a variety of EMI sources FIG. 5 shows an example EMI detector assembly 550 that includes multiple coils as EMI detectors 110. The EMI detectors 110 are coupled to a stand 552, which can be in some instances coupled to a cart or a wheeled base to facilitate moving the EMI detector assembly 550 between rooms and/or to different locations within a room. The EMI detector assembly 550 can include coils with orthogonal directionality for increased detection capability for a variety of EMI sources. In the example shown in FIG. 5, the coils can be distributed 360 degrees about a center of the stand 552. As in other examples, the EMI detector assembly 550 can be used in combination with other EMI detector types, such as electrodes and/or surface coils placed on the patient's body, but located external to the MRI system's imaging volume.

As another example, the external EMI detector 110 can include one or more electrodes on the body, but outside of the magnet 102. As still another example, the external EMI detector 110 can include one or more surface coils on the body, but outside of the magnet 102. Advantageously, using electrodes and/or surface coils positioned on the subject's body can allow for more direct measurement of nuisance EMI signals that may be amplified or otherwise "piped" by the body, which may act like an antenna. Additionally or alternatively, a combination of pickup coil(s), electrode(s), or surface coil(s) can also be used.

A controller 112 is coupled to the magnet 102, gradient coil(s) 104, RF coil 106, and external EMI detector 110, and is configured to control the operation of the magnet 102, gradient coil(s) 104, and RF coil 106 to acquire magnetic resonance data from a subject. For example, controller 112 is configured to drive the gradient coil(s) 104 and RF coil 106 for gradient waveform generation and RF waveform generation, respectively, using known hardware and methods. In addition, the controller 112 is configured to record magnetic resonance signals received by the RF coil 106 as magnetic resonance data acquired from the subject.

The controller 112 is also configured to acquire EMI signal data with the EMI detector 110, and to postprocess the magnetic resonance data using the EMI signal data in order to remove or otherwise reduce EMI-related artifacts from the magnetic resonance data. For instance, the controller 112 is configured to record EMI signals received by the external EMI detector 110 as EMI signal data and to postprocess the magnetic resonance data using the EMI signal data as described in the present disclosure. The controller 112 may also be configured to generate images based on the magnetic resonance data, whether before or after the magnetic resonance data have been postprocessed to remove or otherwise reduce EMI-related artifacts using the EMI signal data.

In one aspect of the present disclosure, calibration data can be acquired by the primary coil and external EMI detector(s) shot-to-shot during the dead-time in an imaging pulse sequence to enable a dynamic transfer function calculation. This dynamic model can more accurately correct for time-varying EMI sources.

As a non-limiting example, the imaging pulse sequence may be a RARE pulse sequence. In each acquisition window of the RARE sequence, the external EMI detector(s) samples "noise data" (i.e., the EMI signal data) simultaneously with the primary coil's acquisition of magnetic resonance data (e.g., echo signals). In addition, "noise" can be sampled from both the EMI detector(s) and the primary imaging coil at the end of each echo train. As an example, 2.56 ms of "noise" can be sampled from both the EMI detector(s) and the primary imaging coil at the end of each echo train.

The noise data acquired from the end of the echo train dynamically models the relationship (i.e., transfer function) between signals measured by the EMI detector(s) and the primary imaging coil. A new transfer function can thus be generated for each repetition time ("TR") period in the pulse sequence to account for environmental changes during the sequence.

Assuming $C_{pri,N}$ to be the Fourier transform (e.g., fast Fourier transform ("FFT")) of the primary coil calibration data, where N is the number of acquisition points, and $C_{ext,N}$ to be the FFT of the external EMI detector calibration data, the transfer function is, $$H_N = \frac{C_{pri,N}}{C_{ext,N}}; \quad (1)$$

for each TR, providing the gain and phase relationship for every frequency bin in the bandwidth. Defining $S_{pri,N}$ and $S_{ext,N}$ as the primary coil magnetic resonance data and the "noise data" acquired from the external EMI detector (i.e., the EMI signal data) during the echo train, the EMI mitigated imaging data can be computed as, $$S_{pri,N} - (H_N \times S_{ext,N}) \quad (2),$$

In another aspect of the present disclosure, calibration data is not needed and that the model can instead be fit directly using data acquired during signal reception. When signals are simultaneously acquired by both the EMI detector(s) and the primary MR coil, EMI correction can be implemented without additional acquisition periods beyond what is needed for imaging. In these instances, the EMI correction method can be added to any sequence without modifications.

As a non-limiting example, detector acquisition lines with similar signal properties are grouped together to build a time-varying model that is more robust to noise compared to using single acquisition lines. This approach provides larger convolution windows to correlate the EMI signal data, which yields more accurate impulse response functions and better EMI removal.

A generalized model that can dynamically adjust to time-varying external noise sources can be used for EMI correction. The model allows for simultaneously acquired data from multiple EMI detector(s) to be regressed from the primary MR coil data. In an example, a linear relationship can be assumed between the k-space signal measured by the primary receive coil, $s(k_x,k_y)$, and the unwanted EMI on the imaging coil, $e'(k_x,k_y)$, and the desired EMI-free k-space data, $s'(k_x,k_y)$:

$$s(k_x,k_y) = e'(k_x,k_y) + s'(k_x,k_y) \quad (3).$$

To allow for accurate estimation and removal of the EMI, it can be assumed that data are available from $N_c$ external detectors, $e_i(k_x,k_y)$ with $i=1, \ldots, N_c$. A linear convolution model along the readout ($k_x$) and phase encoding ($k_y$) directions relates the EMI observed by the primary imaging coil to that observed by the external EMI detector detector(s):

$$e' = (k_x,k_y) = \sum_{i=1}^{N_c} e_i(k_x,k_y) * h_i(k_x,k_y). \quad (4)$$

In this example implementation, each impulse response function is assumed to have limited spectral support; that is, $h_i(k_x,k_y)=0$, $|k_x|>\Delta k_x$ or $|k_y|>\Delta k_y$. In the most restrictive case, when $\Delta k_x=1$ and $\Delta k_y=1$, then Eqn. (4) represents a scalar combination of the detector coils:

$$e'(k_x,k_y) = \sum_{i=1}^{N_c} e_i(k_x,k_y) \cdot h_i. \quad (5)$$

The linear convolutional form described in Eqn. (4) can be incorporated into Eqn. (3) and written in matrix form as:

$$\vec{s} = \vec{e}' + \vec{s}' = E\vec{h} + \vec{s}' \quad (6).$$

Figure 6A:
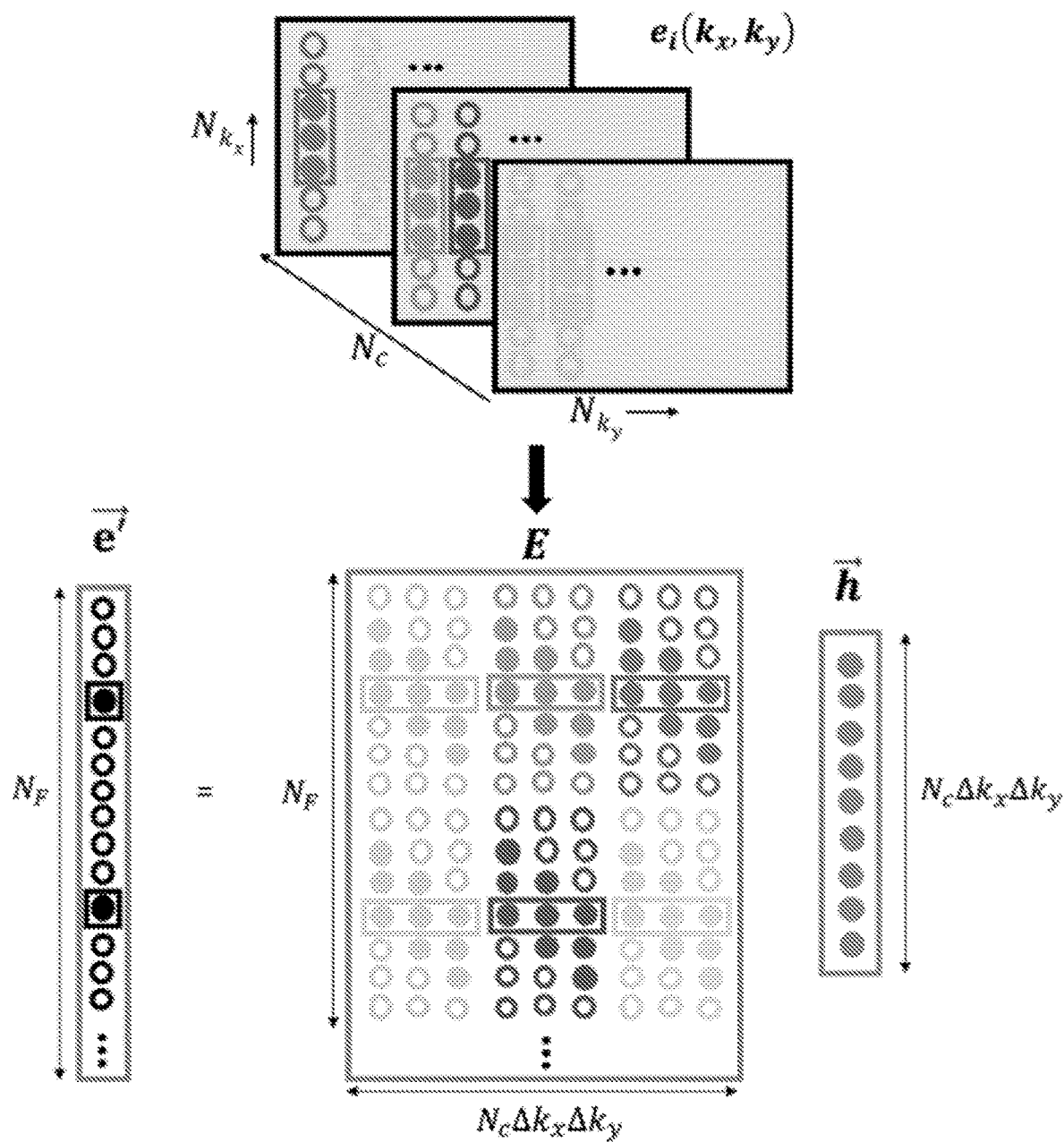
FIG. 6A illustrates an example of forming a convolutional model for correcting EMI.

The impulse response vector $\vec{h} \in \mathbb{C}^{N_F \times N_C \Delta k_x \Delta k_y}$ is a concatenation of the spectral components for the impulse response functions, and the EMI convolution matrix $E \in \mathbb{C}^{N_F \times N_C \Delta k_x \Delta k_y}$ is a block-Toeplitz matrix mapping the EMI detector coil data to $N_F$, observations from the primary receive coil. An illustration of fitting impulse response functions is shown in FIG. 6A. In the case of temporally static EMI, a single set of impulse response functions can be valid across the full extent of k-space and all available data could be used during the fit (i.e., $N_F = N_{k_x} \cdot N_{k_y}$). While $k_x$ and $k_y$ coordinates are used in the present description for familiarity and convenience to index data points within the readouts ($k_x$) and between readouts ($k_y$), it will be appreciated that the methods described in the present disclosure do not depend on the specific k-space sampling trajectory used.

As a non-limiting example, a least squares solution, $\vec{h} = E^\dagger \vec{s}$, can be used to fit the model and the EMI-mitigated data can be produced as $\vec{s}' = \vec{s} - E\vec{h}$. It is important to note that this method assumes low correlation between the spectral content of the image and noise sources. If such a correlation does exist between the spectral content of the image and noise sources this would merely lead to smoothly varying sensitivity loss across the image due to the limited support assumed for each $h_i(k_x, k_y)$.

Figure 6B:
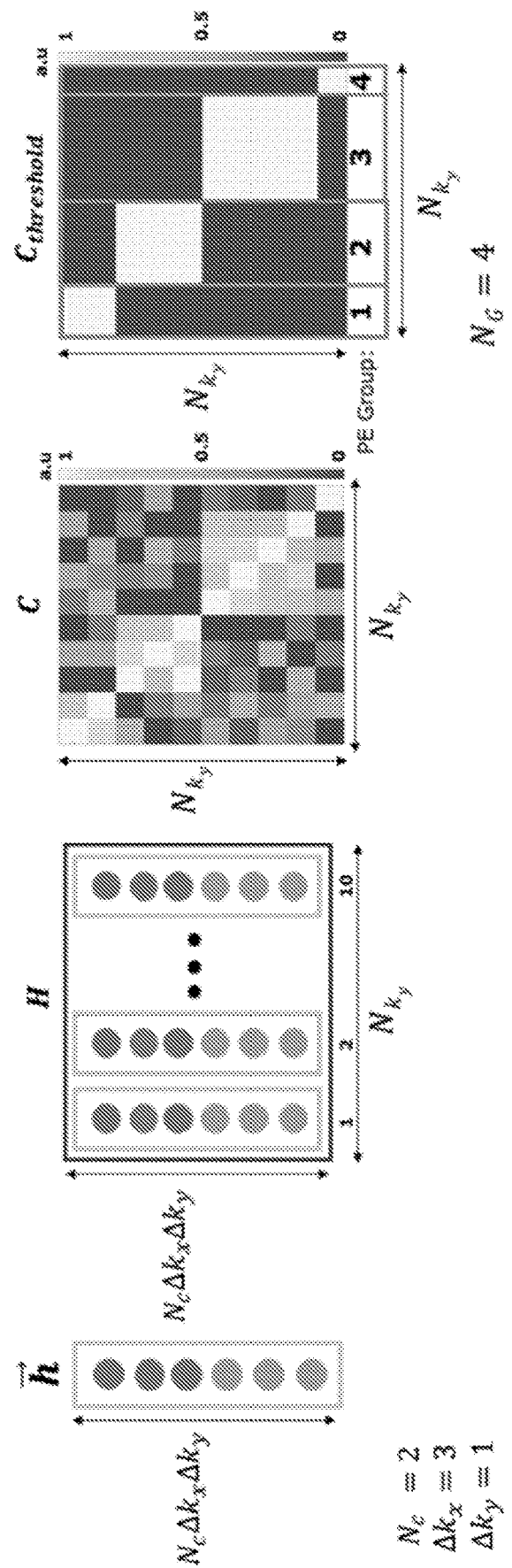
FIG. 6B illustrates an example of forming temporal clusters of data for use in a convolutional EMI correction model.

The methods described in the present disclosure can be generalized to scenarios where EMI sources are time-varying by assuming limited temporal windows (e.g., a single phase encode) and fitting different impulse response functions for each temporal instance. As the number of observations in each temporal window becomes small the estimation robustness may become degraded. To minimize this effect, the data can be dynamically binned into larger temporal windows that have consistent EMI patterns. This can be accomplished by first constructing a matrix, H, that contains the $\vec{h}$ vectors generated for the different temporal windows, $N_w$. The $\Delta k_y$ used to construct the H matrix is restricted by $N_w$. As a non-limiting example, $N_w=1$ such that $\Delta k_y=1$. A matrix, C, can then be constructed by autocorrelating the normalized matrix, H. Consistent EMI sources will lead to similar impulse response functions, which in turn will produce high levels of correlation. The binning locations can be determined with standard clustering approaches, such as thresholding the correlation matrix, C, to form a thresholded correlation matrix, $C_{threshold}$ as shown in FIG. 6B. A final pass of the method can then be performed to estimate and remove EMI from each dynamically determined temporal window. Here, there is no restriction on $\Delta k_y$.

Figure 7:
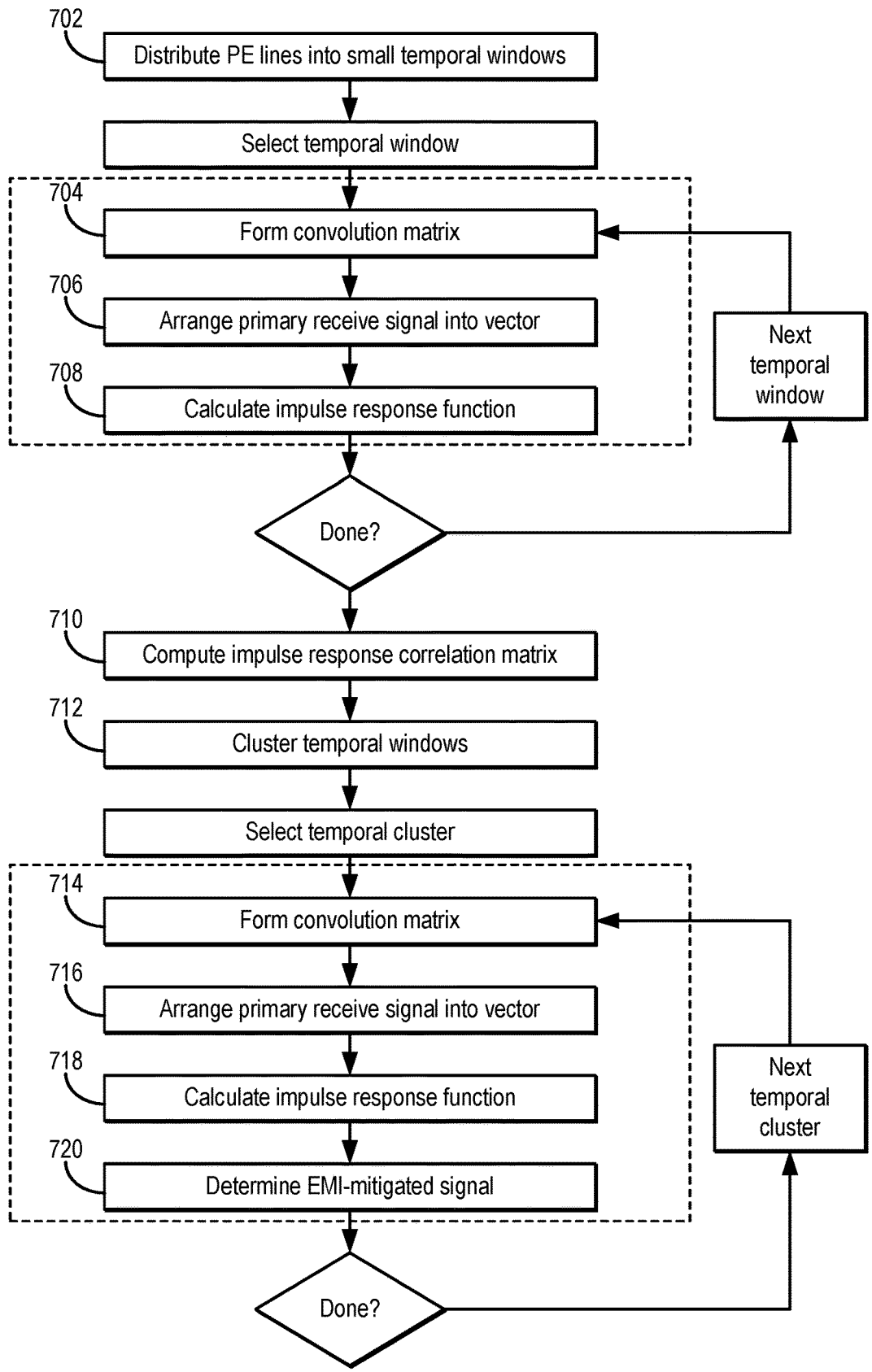
FIG. 7 illustrates an example of a calibration-free external dynamic interference estimation and removal ("EDITER") method based on a dynamic model that includes a kernel that relates the external detectors' signal to the artifact's appearance in the recording of primary imaging coil.

A general workflow for this generalized algorithm is shown in FIG. 7. First, phase encode lines are distributed in $N_w$ small temporal windows of size $W=N_{PE}/N_w$, as indicated at step 702. Then, for each temporal window $1 \leq k \leq N_w$, the following sub-steps are performed. A convolution matrix, $E_{(k)}$, is formed, as indicated at step 704. The convolution matrix can be formed, for example, as shown in FIG. 6A and described above. The primary receive signal is then arranged into a vector, $\vec{s}_{(k)}$, as indicated at step 706. Then, the impulse response functions, are calculated, as indicated at step 708. The impulse response functions can be calculated as $\vec{h}_{(k)} = E_{(k)}^\dagger \vec{s}_{(k)}$. As a non-limiting example, the impulse response vectors can be determined using a convolution window size of $\Delta k_x=7$ and $\Delta k_y=1$. Increasing the convolution window size to $\Delta k_x>1$ aids the correction, but can require longer processing time. Thus, there is a tradeoff between the amount of correction and time utilized. As a more general example, the convolution window size can be selected from the range $3 < \Delta k_x < 8$.

After the impulse response functions have been computed for each temporal window, the impulse response correlation matrix is computed, as indicated at step 710. For instance, the impulse response correlation matrix can be computed as $C_{i,j} = \langle \vec{h}_{(i)}, \vec{h}_{(j)} \rangle$, $1 \leq i, j \leq N_w$. The temporal windows are then clustered into $N_G$ groups, as indicated at step 712. For instance, the temporal windows can be clustered as described above and shown in FIG. 6B.

Then, for each temporal cluster, $1 \leq g \leq N_G$, the following sub-steps are performed. A convolution matrix, $E_{(g)}$ is formed, as indicated at step 714. The primary receive signal is arranged into a vector, $\vec{s}_{(g)}$, as indicated at step 716. Impulse response functions are then computed, as indicated at step 718. For instance, the impulse response functions can be computed as $\vec{h}_{(g)} = E_{(g)}^\dagger \vec{s}_{(g)}$. The EMI-mitigated signal is then determined, as indicated at step 720. For instance, the EMI-mitigated signal can be determined as $\vec{s}'_{(g)} = \vec{s}_{(g)} - E_{(g)} \vec{h}_{(g)}$.

In the embodiment described above with respect to FIG. 6, phase encode lines are grouped into correlated temporal windows and separate impulse responses are created for each group. Alternatively, instead of PE grouping, separate impulse responses can be determined for each PE line.

In other aspects of the present disclosure, complex cancellation weights for each external EMI detector can be calculated without calibration data using a masked version of the primary coil's image. In still another aspect of the present disclosure, parallel imaging models can be used to describe the relationship between the artifacts observed at the external EMI detector(s) and those seen by the primary imaging coil. In one such instance, a GRAPPA kernel approach can be used to form the EMI correction model. In this case, shifted versions of the EMI signal data form a larger "EMI GRAPPA matrix" and the shifted versions of the primary coil data form a larger "primary GRAPPA matrix". The GRAPPA kernel can then be linearly calculated from the matrices and used for the EMI correction. If the frequency content of the EMI signal data and the magnetic resonance data are sufficiently different, masking of the primary magnetic resonance data's image may not be necessary.

In yet another aspect of the present disclosure, a dynamic EMI correction model can also be formed with the addition of low-rank temporal elements to the correction model.

As noted above, in some implementations, electrodes can be used as the external EMI detector(s) instead of external pick-up coils, as described above. The small, portable MRI magnet can be electromagnetically shielded, but EMI can be "piped" into the primary MRI coil through the external parts of the patient's body. Therefore, a more direct measure of the EMI data can be made via electrodes on the patient's body. This can, advantageously, improve the accuracy of the EMI suppression.

Additionally or alternatively, MRI surface coils could be used as EMI detectors on the external parts of the patient's body. This could also allow for a direct measurement of the EMI that is "piped" through the patient's body, while maintaining similar measurement characteristics to the primary MRI coil (compared to electrode measurements).

Figure 8:
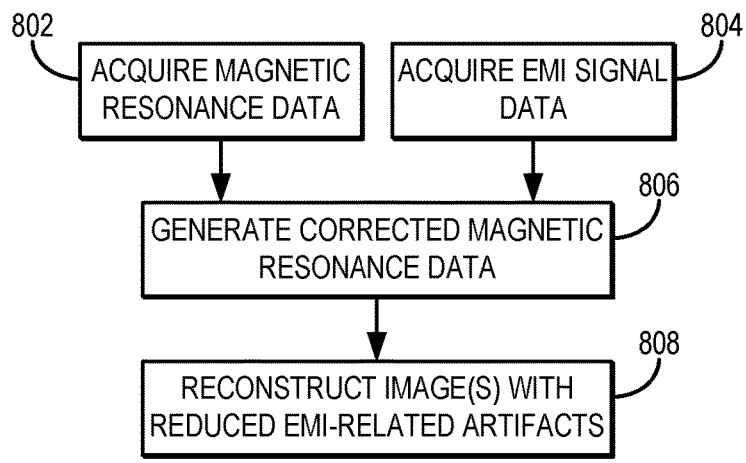
FIG. 8 is a flowchart setting forth the steps of an example method for generating a magnetic resonance image in which EMI-related artifacts have been removed or otherwise reduced.

Referring now to FIG. 8, a flowchart is illustrated as setting forth the steps of an example method for removing or otherwise reducing EMI-related artifacts in magnetic resonance images. The method includes acquiring magnetic resonance data with an MRI system, as indicated at step 802. The method also includes acquired EMI signal data with one or more EMI detectors that are located external to the imaging volume of the MRI system, as indicated at step 804. As described above, the EMI signal data are acquired contemporaneously with the magnetic resonance data. As also described above, in some instances calibration data can be acquired using the MRI system, the EMI detector(s), or both. These calibration data can be acquired at the end of the TR of the pulse sequence, as described above.

The magnetic resonance data are then corrected to remove or otherwise reduce EMI-related artifacts using the EMI signal data, as indicated at step 806. As described above, the correction process can implement a number of different techniques.

In one example, a transfer function is computed from calibration data contained in both the magnetic resonance data and the EMI signal data. The transfer function may be computed statically (e.g., after all of the data have been acquired), or dynamically (e.g., while data are still being acquired, such as shot-to-shot). The transfer function can then be applied to the EMI signal data and the result subtracted from the magnetic resonance data in order to generate the corrected magnetic resonance data.

In another example, complex-valued cancellation weights for each external EMI detector can be calculated without the magnetic resonance data or EMI signal data requiring calibration data. For instance, an image can be reconstructed from the magnetic resonance data and masked, from which the complex-valued cancellation weights can be computed. The complex-valued cancellation weights can then be applied to the EMI signal data and the result subtracted from the magnetic resonance data in order to generate the corrected magnetic resonance data.

In still another example, parallel imaging models can be used to describe the relationship between the artifacts observed at the external EMI detector(s) and those seen by the primary imaging coil. In one such instance, a GRAPPA kernel approach can be used to form the EMI correction model. In this case, shifted versions of the EMI signal data form a larger "EMI GRAPPA matrix" and the shifted versions of the primary coil data form a larger "primary GRAPPA matrix". The GRAPPA kernel can then be linearly calculated from the matrices and used for the EMI correction.

In one or more of the preceding methods, a dynamic EMI correction model can also be formed with the addition of low-rank temporal elements to the correction model.

One or more images of the subject are then reconstructed from the corrected magnetic resonance data, as indicated at step 808. By way of the corrections performed on the magnetic resonance data, the reconstructed images will have EMI-related artifacts removed or otherwise reduced.

Figure 9:
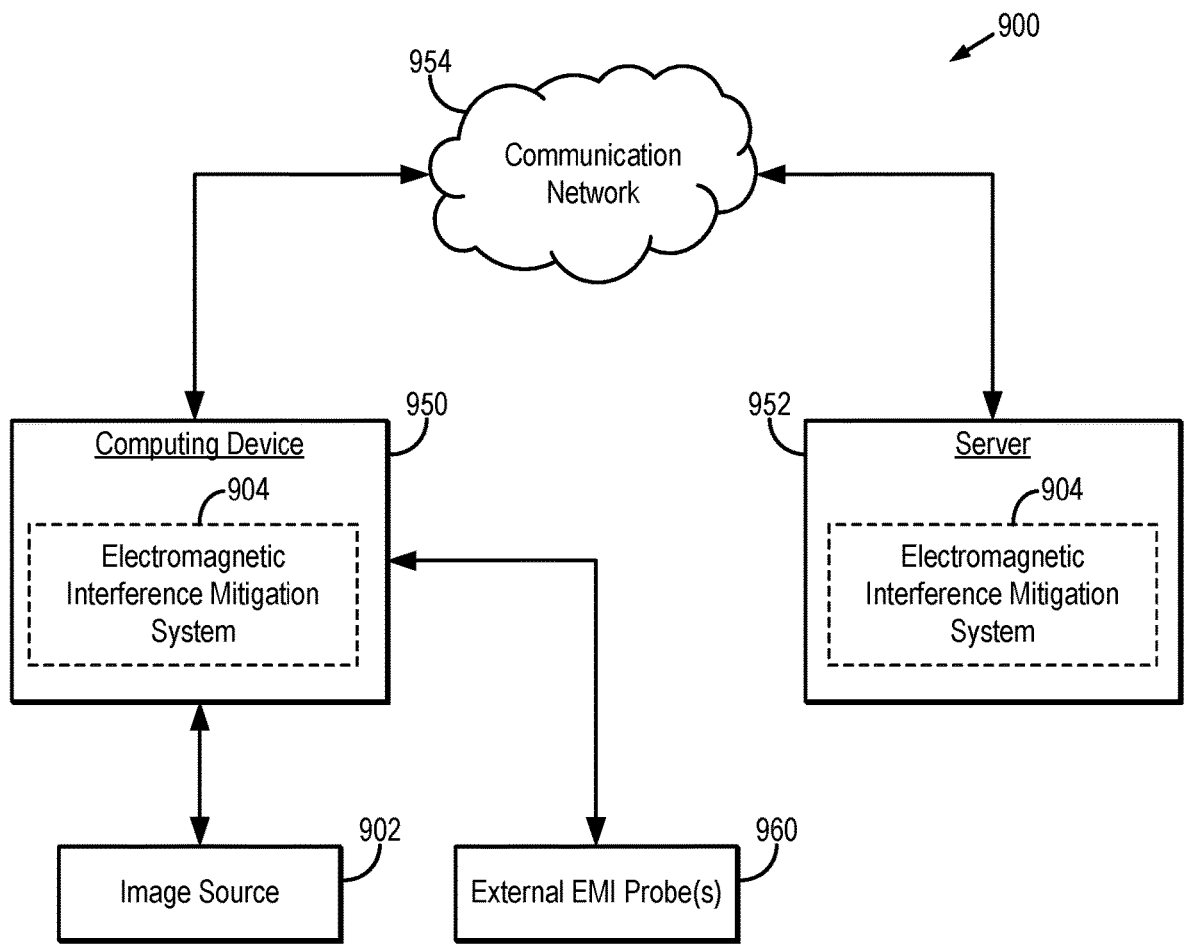
FIG. 9 is a block diagram of an example EMI mitigation system that can be used to generate magnetic resonance images in which EMI-related artifacts have been removed or otherwise reduced.

Referring now to FIG. 9, an example of a system 900 for generating magnetic resonance images with reduced EMI artifacts in accordance with some embodiments of the systems and methods described in the present disclosure is shown. As shown in FIG. 9, a computing device 950 can receive one or more types of data (e.g., magnetic resonance data, calibration data) from image source 902, which may be an MRI system, and also receive one or more types of data (e.g., EMI signal data, calibration data) from external EMI detector(s) 960. In some embodiments, computing device 950 can execute at least a portion of a electromagnetic interference ("EMI") mitigation system 904 to generate magnetic resonance images with reduced EMI-related artifacts from magnetic resonance data received from the image source 902.

Additionally or alternatively, in some embodiments, the computing device 950 can communicate information about data received from the image source 902 and/or external EMI detector(s) 960 to a server 952 over a communication network 954, which can execute at least a portion of the EMI mitigation system 904. In such embodiments, the server 952 can return information to the computing device 950 (and/or any other suitable computing device) indicative of an output of the EMI mitigation system 904.

In some embodiments, computing device 950 and/or server 952 can be any suitable computing device or combination of devices, such as a desktop computer, a laptop computer, a smartphone, a tablet computer, a wearable computer, a server computer, a virtual machine being executed by a physical computing device, and so on. The computing device 950 and/or server 952 can also perform postprocessing corrections and reconstruct images from the data.

In some embodiments, image source 902 can be any suitable source of image data (e.g., magnetic resonance data, images reconstructed from magnetic resonance data), such as an MRI system, another computing device (e.g., a server storing image data), and so on. In some embodiments, image source 902 can be local to computing device 950. For example, image source 902 can be incorporated with computing device 950 (e.g., computing device 950 can be configured as part of a device for capturing, scanning, and/or storing images). As another example, image source 902 can be connected to computing device 950 by a cable, a direct wireless link, and so on. Additionally or alternatively, in some embodiments, image source 902 can be located locally and/or remotely from computing device 950, and can communicate data to computing device 950 (and/or server 952) via a communication network (e.g., communication network 954).

As described above, the external EMI detector(s) 960 can include one or more pick-up coils, electrodes, surface coils, or combinations thereof. The external EMI detector(s) 960 can be connected to computing device 950 by a cable, a direct wireless link, and so on. Additionally or alternatively, in some embodiments, the external EMI detector(s) 960 can be located locally and/or remotely from computing device 950, and can communicate data to computing device 950 (and/or server 952) via a communication network (e.g., communication network 954).

In some embodiments, communication network 954 can be any suitable communication network or combination of communication networks. For example, communication network 954 can include a Wi-Fi network (which can include one or more wireless routers, one or more switches, etc.), a peer-to-peer network (e.g., a Bluetooth network), a cellular network (e.g., a 3G network, a 4G network, etc., complying with any suitable standard, such as CDMA, GSM, LTE, LTE Advanced, WiMAX, etc.), a wired network, and so on. In some embodiments, communication network 108 can be a local area network, a wide area network, a public network (e.g., the Internet), a private or semi-private network (e.g., a corporate or university intranet), any other suitable type of network, or any suitable combination of networks. Communications links shown in FIG. 9 can each be any suitable communications link or combination of communications links, such as wired links, fiber optic links, Wi-Fi links, Bluetooth links, cellular links, and so on.

Figure 10:
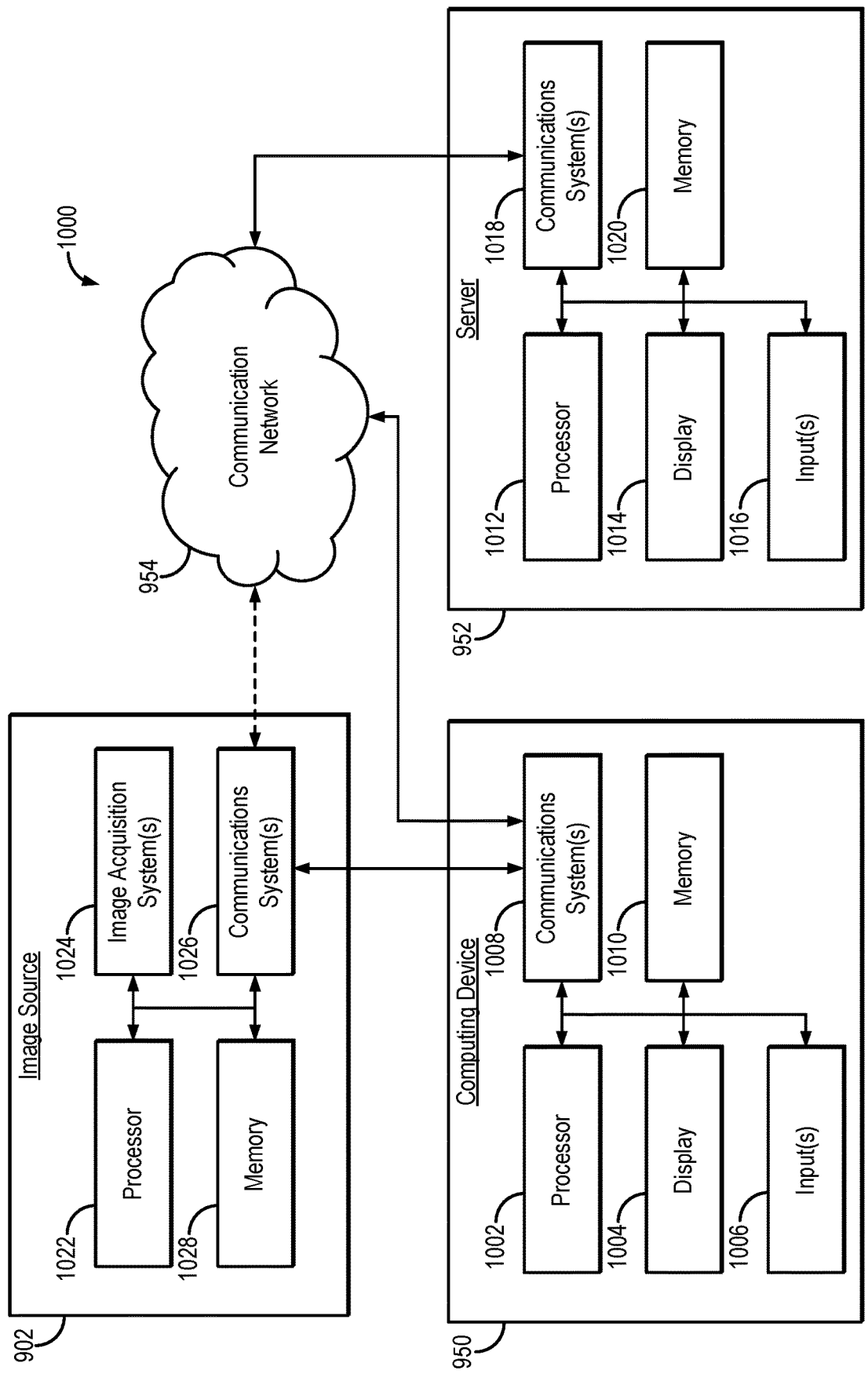
FIG. 10 is a block diagram of example components that can implement the system of FIG. 9.

Referring now to FIG. 10, an example of hardware 1000 that can be used to implement image source 902, computing device 950, and server 954 in accordance with some embodiments of the systems and methods described in the present disclosure is shown. As shown in FIG. 10, in some embodiments, computing device 950 can include a processor 1002, a display 1004, one or more inputs 1006, one or more communication systems 1008, and/or memory 1010. In some embodiments, processor 1002 can be any suitable hardware processor or combination of processors, such as a central processing unit ("CPU"), a graphics processing unit ("GPU"), and so on. In some embodiments, display 1004 can include any suitable display devices, such as a computer monitor, a touchscreen, a television, and so on. In some embodiments, inputs 1006 can include any suitable input devices and/or sensors that can be used to receive user input, such as a keyboard, a mouse, a touchscreen, a microphone, and so on.

In some embodiments, communications systems 1008 can include any suitable hardware, firmware, and/or software for communicating information over communication network 954 and/or any other suitable communication networks. For example, communications systems 1008 can include one or more transceivers, one or more communication chips and/or chip sets, and so on. In a more particular example, communications systems 1008 can include hardware, firmware and/or software that can be used to establish a Wi-Fi connection, a Bluetooth connection, a cellular connection, an Ethernet connection, and so on.

In some embodiments, memory 1010 can include any suitable storage device or devices that can be used to store instructions, values, data, or the like, that can be used, for example, by processor 1002 to present content using display 1004, to communicate with server 952 via communications system(s) 1008, and so on. Memory 1010 can include any suitable volatile memory, non-volatile memory, storage, or any suitable combination thereof. For example, memory 1010 can include RAM, ROM, EEPROM, one or more flash drives, one or more hard disks, one or more solid state drives, one or more optical drives, and so on. In some embodiments, memory 1010 can have encoded thereon, or otherwise stored therein, a computer program for controlling operation of computing device 950. In such embodiments, processor 1002 can execute at least a portion of the computer program to present content (e.g., images, user interfaces, graphics, tables), receive content from server 952, transmit information to server 952, and so on.

In some embodiments, server 952 can include a processor 1012, a display 1014, one or more inputs 1016, one or more communications systems 1018, and/or memory 1020. In some embodiments, processor 1012 can be any suitable hardware processor or combination of processors, such as a CPU, a GPU, and so on. In some embodiments, display 1014 can include any suitable display devices, such as a computer monitor, a touchscreen, a television, and so on. In some embodiments, inputs 1016 can include any suitable input devices and/or sensors that can be used to receive user input, such as a keyboard, a mouse, a touchscreen, a microphone, and so on.

In some embodiments, communications systems 1018 can include any suitable hardware, firmware, and/or software for communicating information over communication network 954 and/or any other suitable communication networks. For example, communications systems 1018 can include one or more transceivers, one or more communication chips and/or chip sets, and so on. In a more particular example, communications systems 1018 can include hardware, firmware and/or software that can be used to establish a Wi-Fi connection, a Bluetooth connection, a cellular connection, an Ethernet connection, and so on.

In some embodiments, memory 1020 can include any suitable storage device or devices that can be used to store instructions, values, data, or the like, that can be used, for example, by processor 1012 to present content using display 1014, to communicate with one or more computing devices 950, and so on. Memory 1020 can include any suitable volatile memory, non-volatile memory, storage, or any suitable combination thereof. For example, memory 1020 can include RAM, ROM, EEPROM, one or more flash drives, one or more hard disks, one or more solid state drives, one or more optical drives, and so on. In some embodiments, memory 1020 can have encoded thereon a server program for controlling operation of server 952. In such embodiments, processor 1012 can execute at least a portion of the server program to transmit information and/or content (e.g., data, images, a user interface) to one or more computing devices 950, receive information and/or content from one or more computing devices 950, receive instructions from one or more devices (e.g., a personal computer, a laptop computer, a tablet computer, a smartphone), and so on.

In some embodiments, image source 902 can include a processor 1022, one or more image acquisition systems 1024, one or more communications systems 1026, and/or memory 1028. In some embodiments, processor 1022 can be any suitable hardware processor or combination of processors, such as a CPU, a GPU, and so on. In some embodiments, the one or more image acquisition systems 1024 are generally configured to acquire data, images, or both, and can include an MRI system, which may be a portable MRI system as described above. Additionally or alternatively, in some embodiments, one or more image acquisition systems 1024 can include any suitable hardware, firmware, and/or software for coupling to and/or controlling operations of an MRI system. In some embodiments, one or more portions of the one or more image acquisition systems 1024 can be removable and/or replaceable.

Note that, although not shown, image source 902 can include any suitable inputs and/or outputs. For example, image source 902 can include input devices and/or sensors that can be used to receive user input, such as a keyboard, a mouse, a touchscreen, a microphone, a trackpad, a trackball, and so on. As another example, image source 902 can include any suitable display devices, such as a computer monitor, a touchscreen, a television, etc., one or more speakers, and so on.

In some embodiments, communications systems 1026 can include any suitable hardware, firmware, and/or software for communicating information to computing device 950 (and, in some embodiments, over communication network 954 and/or any other suitable communication networks). For example, communications systems 1026 can include one or more transceivers, one or more communication chips and/or chip sets, and so on. In a more particular example, communications systems 1026 can include hardware, firmware and/or software that can be used to establish a wired connection using any suitable port and/or communication standard (e.g., VGA, DVI video, USB, RS-232, etc.), Wi-Fi connection, a Bluetooth connection, a cellular connection, an Ethernet connection, and so on.

In some embodiments, memory 1028 can include any suitable storage device or devices that can be used to store instructions, values, data, or the like, that can be used, for example, by processor 1022 to control the one or more image acquisition systems 1024, and/or receive data from the one or more image acquisition systems 1024; to images from data; present content (e.g., images, a user interface) using a display; communicate with one or more computing devices 950; and so on. Memory 1028 can include any suitable volatile memory, non-volatile memory, storage, or any suitable combination thereof. For example, memory 1028 can include RAM, ROM, EEPROM, one or more flash drives, one or more hard disks, one or more solid state drives, one or more optical drives, and so on. In some embodiments, memory 1028 can have encoded thereon, or otherwise stored therein, a program for controlling operation of image source 902. In such embodiments, processor 1022 can execute at least a portion of the program to generate images, transmit information and/or content (e.g., data, images) to one or more computing devices 950, receive information and/or content from one or more computing devices 950, receive instructions from one or more devices (e.g., a personal computer, a laptop computer, a tablet computer, a smartphone, etc.), and so on.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (e.g., hard disks, floppy disks), optical media (e.g., compact discs, digital video discs, Blu-ray discs), semiconductor media (e.g., random access memory ("RAM"), flash memory, electrically programmable read only memory ("EPROM"), electrically erasable programmable read only memory ("EEPROM")), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

The present disclosure has described one or more preferred embodiments, and it should be appreciated that many equivalents, alternatives, variations, and modifications, aside from those expressly stated, are possible and within the scope of the invention.

The invention claimed is:

1. A method for generating a magnetic resonance image, the method comprising:
  (a) acquiring magnetic resonance data from a subject using a magnetic resonance imaging (MRI) system using a pulse sequence, wherein the magnetic resonance data include primary calibration data acquired during a dead-time of the pulse sequence;
  (b) acquiring electromagnetic interference (EMI) signal data using at least one EMI detector positioned external to an imaging volume of the MRI system, wherein the EMI signal data include external calibration data acquired during the dead-time of the pulse sequence;
  (c) generating corrected magnetic resonance data by:
    computing an EMI correction model using the primary calibration data in the magnetic resonance data and the external calibration data in the EMI signal data;
    applying the EMI correction model to the EMI signal data, generating output as correction data; and
    subtracting the correction data from the magnetic resonance data, generating output as the corrected magnetic resonance data, wherein artifacts associated with electromagnetic interference are reduced as compared to the magnetic resonance data acquired in step (a); and
  (d) reconstructing an image from the corrected magnetic resonance data, wherein artifacts associated with electromagnetic interference are mitigated in the image.

2. The method of claim 1, wherein the EMI correction model comprises a transfer function.

3. The method of claim 2, wherein the transfer function is a static transfer function.

4. The method of claim 2, wherein the transfer function is a dynamic transfer function.

5. The method of claim 4, wherein the dynamic transfer function is computed as a ratio between the primary calibration data contained in the magnetic resonance data and the external calibration data contained in the EMI signal data.

6. The method of claim 5, wherein the primary calibration data and the external calibration data are acquired during dead-time of each shot of a pulse sequence used to acquire the magnetic resonance data and the dynamic transfer function is updated after each shot of the pulse sequence.

7. The method of claim 6, wherein the primary calibration data and the external calibration data are acquired during dead-time at an end of an echo train in each shot of the pulse sequence.

8. The method of claim 1, wherein the EMI correction model comprises cancellation weights.

9. The method of claim 1, wherein the EMI correction model comprises a parallel imaging reconstruction kernel that accounts for a relationship between the artifacts measured in the EMI signal data and artifacts measured in the magnetic resonance data.

10. The method of claim 1, wherein the EMI correction model includes low-rank temporal elements.

11. The method of claim 1, wherein the EMI signal data are acquired using a single pick-up coil located external the imaging volume of the MRI system.

12. The method of claim 1, wherein the EMI signal data are acquired using a plurality of pick-up coils each located external the imaging volume of the MRI system.

13. The method of claim 1, wherein the at least one EMI detector is coupled to the subject's body at a location external to the imaging volume of the MRI system.

14. The method of claim 13, wherein the at least one EMI detector comprises at least one electrode.

15. The method of claim 13, wherein the at least one EMI detector comprises at least one surface coil.

16. The method of claim 1, wherein the MRI system is a portable MRI system.

17. The method of claim 16, wherein the magnetic resonance data and the EMI signal data are acquired from the subject while the portable MRI system is located outside of an RF-shielded room.

* * * * *